(12) United States Patent
Matsumura et al.

(10) Patent No.: US 8,487,423 B2
(45) Date of Patent: Jul. 16, 2013

(54) INTERCONNECT STRUCTURE OF SEMICONDUCTOR INTEGRATED CIRCUIT AND SEMICONDUCTOR DEVICE INCLUDING THE SAME

(75) Inventors: Yoichi Matsumura, Kyoto (JP); Chie Kabuo, Kyoto (JP); Takako Ohashi, Shiga (JP); Tadafumi Kadota, Osaka (JP); Kazuhiko Fujimoto, Kanagawa (JP); Hirofumi Miyashita, Osaka (JP)

(73) Assignee: Panasonic Corporation, Osaka (JP)

( * ) Notice: Subject to any disclaimer, the term of this patent is extended or adjusted under 35 U.S.C. 154(b) by 101 days.

(21) Appl. No.: 13/169,398

(22) Filed: Jun. 27, 2011

(65) Prior Publication Data

US 2011/0260333 A1    Oct. 27, 2011

Related U.S. Application Data

(63) Continuation of application No. PCT/JP2009/004028, filed on Aug. 21, 2009.

(30) Foreign Application Priority Data

Feb. 10, 2009    (JP) ................................. 2009-028880

(51) Int. Cl.
    *H01L 23/52*    (2006.01)
(52) U.S. Cl.
    USPC ............ 257/691; 257/692; 257/786; 438/129

(58) Field of Classification Search
    USPC ........................... 257/691, 692, 786; 438/129
    See application file for complete search history.

(56) References Cited

U.S. PATENT DOCUMENTS

| 2005/0179134 A1 | 8/2005 | Matsubara |
| 2006/0239102 A1 | 10/2006 | Saita et al. |
| 2008/0048318 A1* | 2/2008 | Sakurabayashi .............. 257/737 |

FOREIGN PATENT DOCUMENTS

| JP | 04-355952 | 12/1992 |
| JP | 06-053449 | 2/1994 |
| JP | 08-008343 | 1/1996 |
| JP | 2000-011011 | 1/2000 |
| JP | 2005-268748 | 9/2005 |
| JP | 2008-053358 | 3/2008 |
| JP | 2008-124286 | 5/2008 |
| WO | WO 2004/077556 A1 | 9/2004 |

* cited by examiner

*Primary Examiner* — Jarrett Stark
*Assistant Examiner* — Nicholas Tobergte
(74) *Attorney, Agent, or Firm* — McDermott Will & Emery LLP (57) ABSTRACT

In a semiconductor integrated circuit chip including an interconnect layer in which there is a limitation on the lengths of interconnects or areas occupied by the interconnects, empty spaces between power supply interconnect segments having the same potential located in parallel to a priority interconnect direction, are shifted relative to each other within the limits of the lengths and areas of power supply interconnects. As a result, a local increase in resistance is dispersed, whereby an influence on a voltage drop is reduced.

10 Claims, 8 Drawing Sheets

INTERCONNECT STRUCTURE OF SEMICONDUCTOR INTEGRATED CIRCUIT AND SEMICONDUCTOR DEVICE INCLUDING THE SAME

CROSS-REFERENCE TO RELATED APPLICATIONS

This is a continuation of PCT International Application PCT/JP2009/004028 filed on Aug. 21, 2009, which claims priority to Japanese Patent Application No. 2009-028880 filed on Feb. 10, 2009. The disclosures of these applications including the specifications, the drawings, and the claims are hereby incorporated by reference in their entirety.

BACKGROUND

The present disclosure relates to power supply interconnect structures including interconnect layers having a limitation on the lengths or areas of interconnects, and semiconductor devices having the power supply interconnect structures.

Conventionally, the layout of a semiconductor integrated circuit is designed in the following manner. Logic elements which are constituent elements of the semiconductor integrated circuit are mounted on a chip based on connection between each logic element, a power supply interconnect for power supply is connected to each logic element, and signal terminals of the logic elements are connected by signal interconnects to provide the intended logic function. In particular, conventionally, in order to supply a stable current, the power supply interconnects are typically connected so that some of the power supply interconnects having the same potential are arranged in a mesh, equally spaced, and have equal widths on the entire chip surface (Japanese Patent Publication No. 2000-11011).

In recent years, the integration density and chip size of a semiconductor integrated circuit have increased. Therefore, the amount of power consumed by the semiconductor integrated circuit has also tended to increase. Therefore, in order to stably supply power to the semiconductor integrated circuit, a power supply interconnect for supplying power is adapted to have an interconnect structure having a wider interconnect width and a longer interconnect length in an interconnect layer having a low resistance. However, when a single power supply interconnect which connects one end to another end of a chip or one end to another end of a range within which power is supplied at the same potential, is too long to be implemented from the point of view of ease of manufacture, the power supply interconnect needs to be limited to less than a predetermined length or area.

Figure 1:
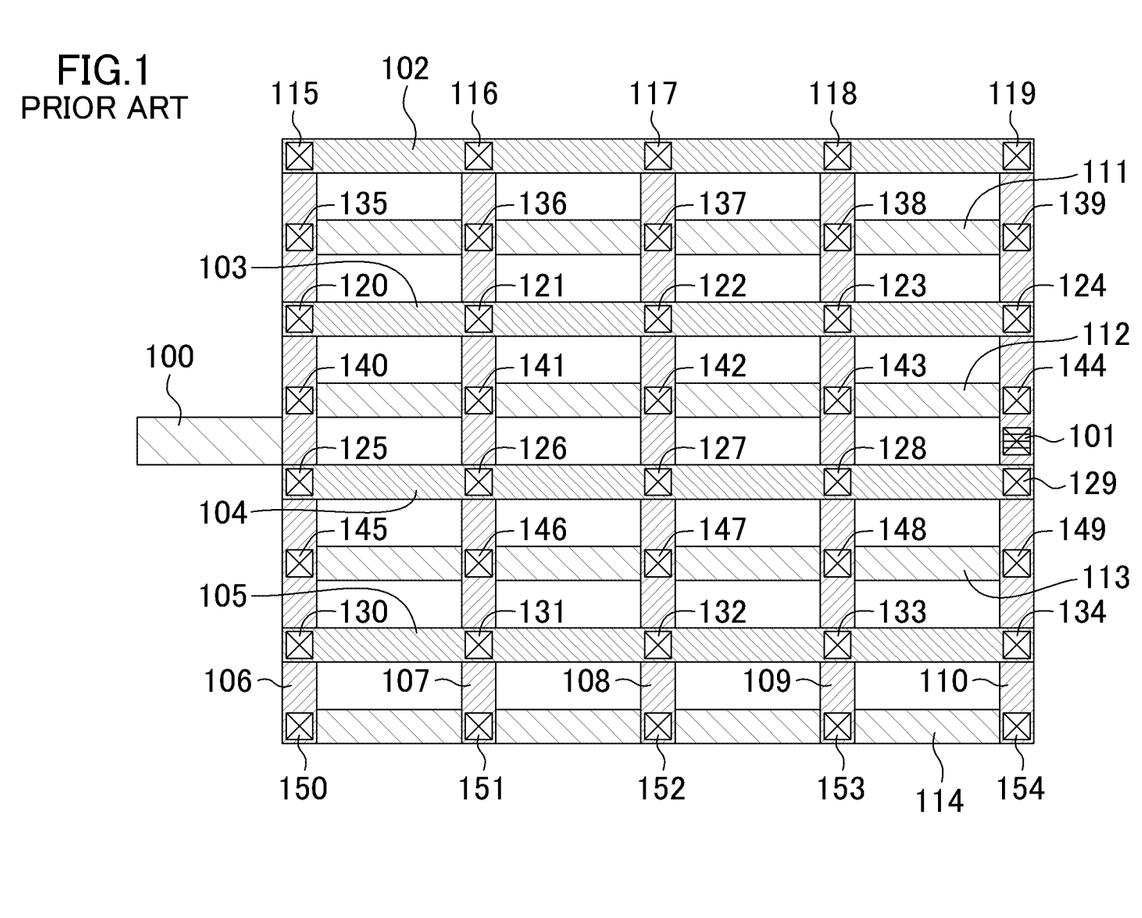
FIG. 1 is a plan view of a basic power supply interconnect structure.

FIG. 1 is a plan view of the power supply interconnect structure described above. For example, the power supply interconnect structure includes three layers, i.e., a first, a second, and a third interconnect layer. The three layers are assumed to be equally spaced and have equal widths. In FIG. 1, a reference numeral 100 indicates a voltage supply, a reference numeral 101 indicates a measurement point, reference numerals 102-105 indicate power supply interconnects in the first interconnect layer, reference numerals 106-110 indicate power supply interconnects in the second interconnect layer, reference numerals 111-114 indicate power supply interconnects in the third interconnect layer, reference numerals 115-134 indicate vias which connect the first and second interconnect layers together, and reference numerals 135-154 indicate vias which connect the second and third interconnect layers together. The power supply interconnects are all assumed to have the same potential.

For ease of description, it is assumed that the resistance value per unit mesh length of the first interconnect layer is 20Ω, the resistance value of the second interconnect layer is negligible, and the resistance value per unit mesh length of the third interconnect layer is 100Ω. It is also assumed that the resistance values of the vias 115-134 connecting the first and second interconnect layers together and the vias 135-154 connecting the second and third interconnect layers together are negligible.

Figure 2:
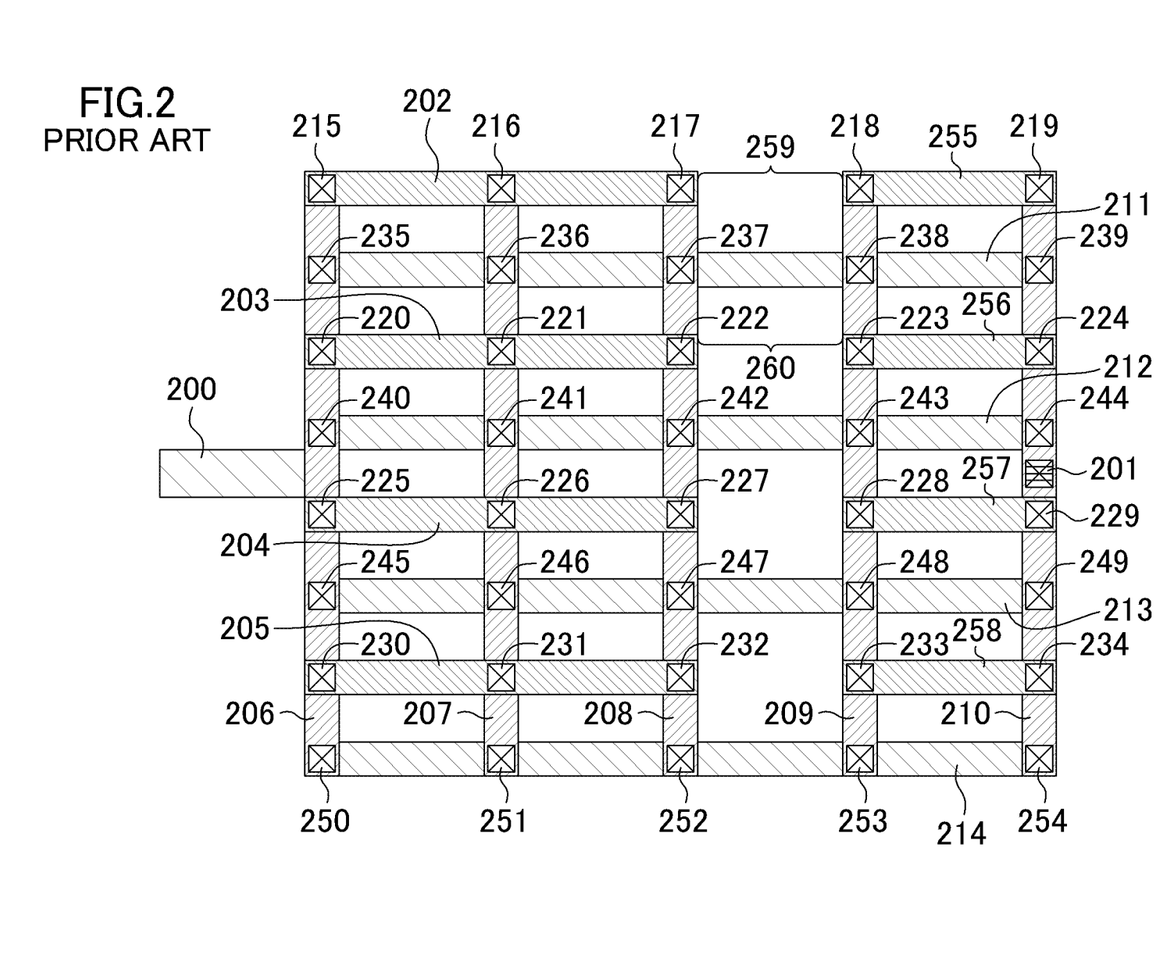
FIG. 2 is a plan view of a power supply interconnect structure in which there is a limitation on the lengths of interconnects and areas occupied by the interconnects.

FIG. 2 is a plan view of a power supply interconnect structure in which there is a limitation on the lengths of interconnects and areas occupied by the interconnects (hereinafter referred to as "the areas of the interconnects" or "the interconnect areas") from the point of view of ease of manufacture as described above. In FIG. 2, for example, in the power supply interconnect structure, interconnects are limited to less than a predetermined length in only the first interconnect layer. In FIG. 2, a reference numeral 200 indicates a voltage supply, a reference numeral 201 indicates a measurement point, reference numerals 202-205 and 255-258 indicate power supply interconnects in the first interconnect layer, reference numerals 206-210 indicate power supply interconnects in the second interconnect layer, reference numerals 211-214 indicate power supply interconnects in the third interconnect layer, reference numerals 215-234 indicate vias which connect the first and second interconnect layers together, and reference numerals 235-254 indicate vias which connect the second and third interconnect layers together. Reference numerals 259 and 260 indicate empty spaces between segments of power supply interconnects between vias in the first interconnect layer in which there is a limitation on the lengths and areas of the interconnects.

Note that, here, it is assumed that the voltage supply 100 and the measurement point 101 of FIG. 1 and the voltage supply 200 and the measurement point 201 of FIG. 2 are located at the same positions, respectively.

Figure 3:
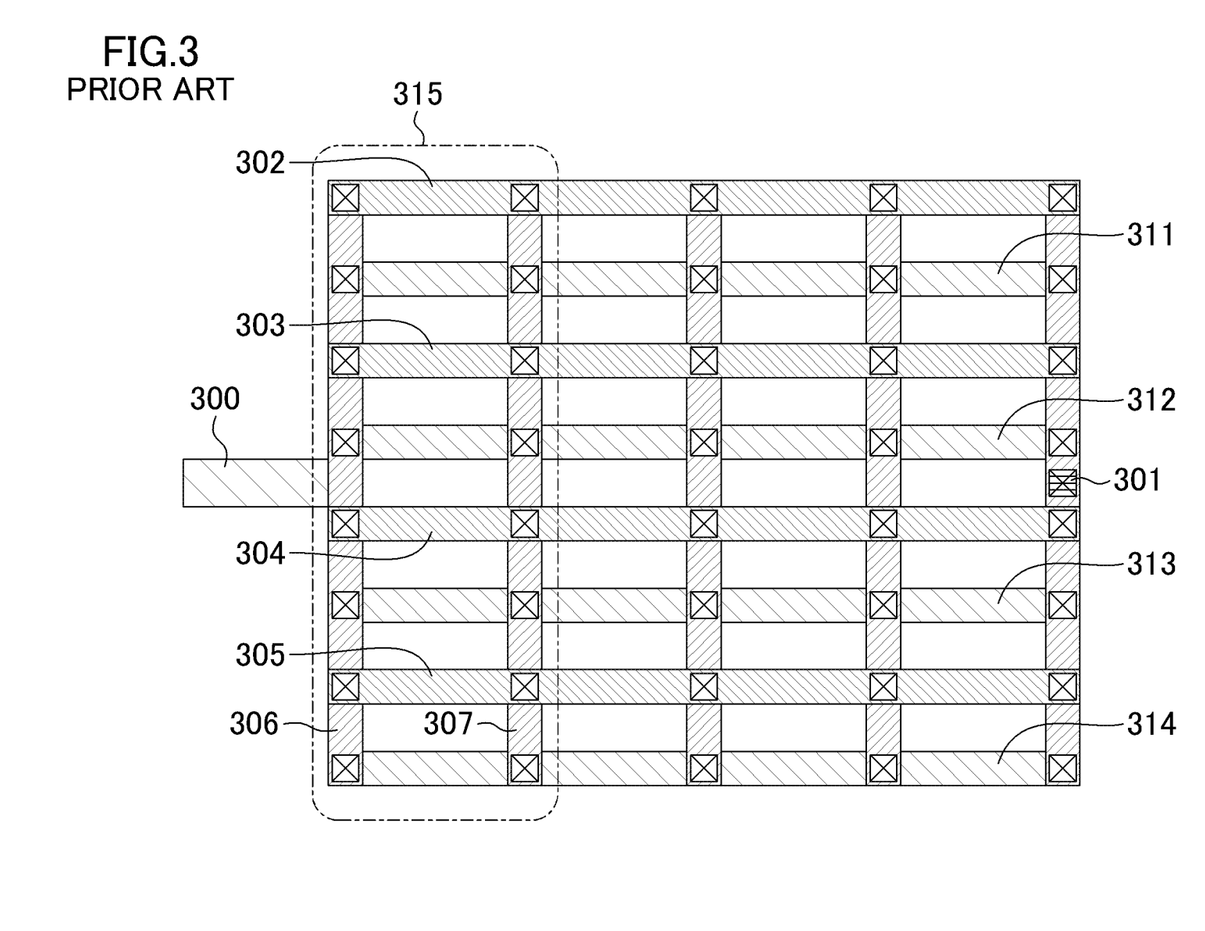
FIG. 3 is a plan view for calculation of a resistance value of the basic power supply interconnect structure.

FIG. 3 is a plan view of the same power supply interconnect structure as that of FIG. 1. In FIG. 3, a reference numeral 300 indicates a voltage supply, which is assumed to be the same as the voltage supply 100 of FIG. 1. A reference numeral 301 indicates a measurement point, which is assumed to be the same as that of the measurement point 101 of FIG. 1. Reference numerals 302-305 indicate power supply interconnects in the first interconnect layer, which are assumed to be the same as the power supply interconnects 102-105 of FIG. 1. Reference numerals 306 and 307 indicates power supply interconnects in the second interconnect layer, which are assumed to be the same as the power supply interconnects 106 and 107 of FIG. 1. Reference numerals 311-314 indicate power supply interconnects in the third interconnect layer, which are assumed to be the same as the power supply interconnects 111-114 of FIG. 1. A reference numeral 315 indicates a calculation range within which calculation is performed using an expression described below.

Figure 4:
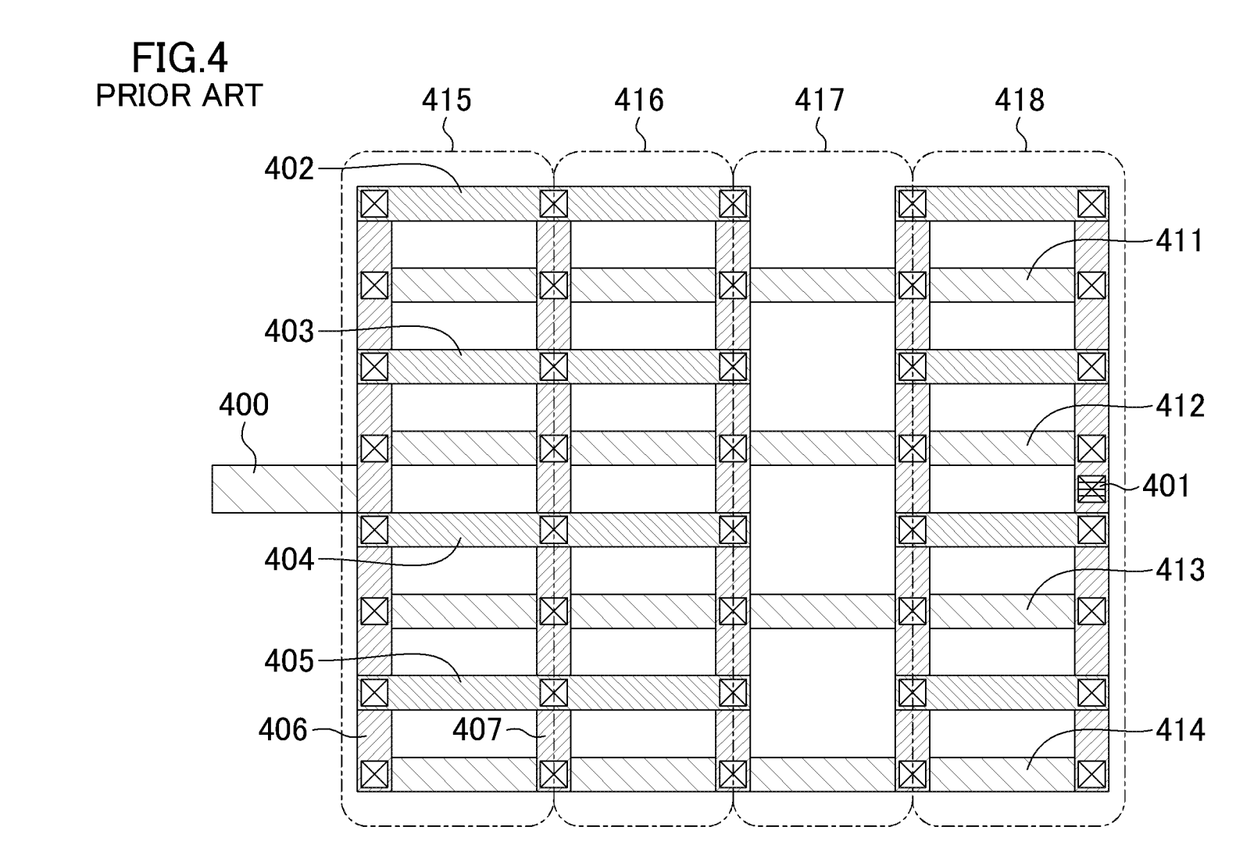
FIG. 4 is a plan view for calculation of a resistance value of the power supply interconnect structure in which there is a limitation on the lengths of interconnects and areas occupied by the interconnects.

FIG. 4 is a plan view of a power supply interconnect structure in which there is a limitation on the lengths and areas of interconnects from the point of view of ease of manufacture as described in FIG. 2, as viewed from above. In FIG. 4, a reference numeral 400 indicates a voltage supply, which is assumed to be the same as the voltage supply 200 of FIG. 2. A reference numeral 401 indicates a measurement point, which is assumed to be the same as the measurement point 201 of FIG. 2. Reference numerals 402-405 indicate power supply interconnects in the first interconnect layer, which are assumed to be the same as the power supply interconnects 202-205 of FIG. 2. Reference numerals 406 and 407 indicate power supply interconnects in the second interconnect layer, which are assumed to be the same as the power supply interconnects 206 and 207 of FIG. 2. Reference numerals 411-414 indicate power supply interconnects in the third interconnect layer, which are assumed to be the same as the power supply interconnects 211-214 of FIG. 2. Reference numerals 415-

418 indicate calculation ranges within which calculation is performed using an expression described below.

Firstly, an influence of the limitation on the lengths and areas of interconnects on a resistance value will be described with reference to FIGS. 3 and 4. The voltage supply 300 and the measurement point 301 of FIG. 3 and the voltage supply 400 and the measurement point 401 of FIG. 4 are assumed to be located at the same positions, respectively, and are also assumed to be located at the same positions as those of the voltage supply 100 and the measurement point 101 of FIG. 1 and the voltage supply 200 and the measurement point 201 of FIG. 2, respectively. Moreover, in FIGS. 3 and 4, as is similar to FIGS. 1 and 2, the power supply interconnect structure is assumed to include three layers, i.e., a first, a second, and a third interconnect layer, which are equally spaced and have equal widths.

A resistance value from the voltage supply 300 to the measurement point 301 is compared with a resistance value from the voltage supply 400 to the measurement point 401.

Firstly, assuming that there is not a limitation on the lengths and areas of interconnects in FIG. 3, a resistance value within the calculation range indicated by the reference numeral 315 will be described. Because it is assumed that the resistance value of the second interconnect layer and the vias is negligible, the resistance value within the calculation range 315 is calculated, taking only the first and third interconnect layers into account.

The resistance value R1 of the first interconnect layer is obtained as follows. There are a total of the four power supply interconnects 302-305 in the first interconnect layer within the calculation range 315. The power supply interconnects 302-305 are connected together in parallel, and the resistance value R1 of the first interconnect layer is calculated by:

$$R1 = 1/(1/20 + 1/20 + 1/20 + 1/20) = 5\ (\Omega) \quad (1)$$

Next, the resistance value R3 of the third interconnect layer is obtained as follows. There are a total of the four power supply interconnects 311-314 in the third interconnect layer within the calculation range 315. The power supply interconnects 311-314 are connected together in parallel, and the resistance value R3 of the third interconnect layer is calculated by:

$$R3 = 1/(1/100 + 1/100 + 1/100 + 1/100) = 25\ (\Omega) \quad (2)$$

The resistance value from the voltage supply 300 to the measurement point 301 is calculated based on the resistance values R1 and R3 as follows. Because it is assumed as described above in FIG. 1 that the interconnects in the first, second, and third interconnect layers are equally spaced and have equal widths, the resistance value R_SUM from the voltage supply 300 to the measurement point 301 is obtained by:

$$R\_SUM = 1/(1/R1 + 1/R3) + 1/(1/R1 + 1/R3) + \quad (3)$$
$$1/(1/R1 + 1/R3) + 1/(1/R1 + 1/R3)$$
$$= 16.7(\Omega)$$

Next, assuming that there is a limitation on the lengths and areas of interconnects, a resistance value will be described with reference to FIG. 4. Also in FIG. 4, as is similar to FIG. 3, because it is assumed that the resistance value of the second interconnect layer and the vias is negligible, the resistance value from the voltage supply 400 to the measurement point 401 is calculated, taking only the first and third interconnect layers into account.

Initially, the resistance value R1' of the first interconnect layer is obtained as follows. As is different from the case of FIG. 3, in FIG. 4, there is no interconnect in the first interconnect layer within the calculation range 417. There are a total of the four power supply interconnects 402-405 in the first interconnect layer within the calculation ranges 415, 416, and 418, and the power supply interconnects 402-405 are connected together in parallel. Therefore, the resistance value R1' of the first interconnect layer is obtained, as is similar to Expression 1 used for FIG. 3, by:

$$R1' = 1/(1/20 + 1/20 + 1/20 + 1/20) = 5\ (\Omega) \quad (4)$$

Note that because there is no power interconnect in the first interconnect layer within the calculation range 417, the resistance value of the first interconnect layer is zero.

Next, the resistance value R3' of the third interconnect layer is obtained as follows. There are a total of the four power supply interconnects 411-414 in the third interconnect layer within the calculation ranges 415-418. The power supply interconnects 411-414 are connected together in parallel. Therefore, the resistance value R3' of the third interconnect layer is calculated, as is similar to the case of FIG. 3, by:

$$R3' = 1/(1/100 + 1/100 + 1/100 + 1/100) = 25\ (\Omega) \quad (5)$$

Therefore, the resistance value R_SUM' from the voltage supply 400 to the measurement point 401 is calculated by:

$$R\_SUM' = 1/(1/R1 + 1/R3) + 1/(1/R1 + 1/R3) + \quad (6)$$
$$R3 + 1/(1/R1 + 1/R3)$$
$$= 37.5(\Omega)$$

Thus, in FIG. 4 where there is a limitation on the lengths and areas of interconnects in FIG. 4, the resistance value is higher than that of FIG. 3. Although it is assumed in the above example that the interconnect layers have different resistance values, a similar effect is obtained even when the interconnect layers have the same resistance value or when the second interconnect layer has a non-negligible resistance.

Next, an influence of the limitation on the lengths and areas of interconnects on a voltage drop will be described with reference to FIGS. 3 and 4.

Here, a voltage drop at any point is represented by:

$$\text{voltage drop} = VDD - \Sigma(Ia \times Ra) \quad (7)$$

where VDD is the voltage value of the voltage supply, Ia is a current value at any measurement point, and Ra is a resistance value between any two points.

Here, it is assumed that there are cells at only the measurement point 301 of FIG. 3 and the measurement point 401 of FIG. 4, and currents at both the measurement points 301 and 401 are a constant current supply. Expression 7 is also represented by:

$$\text{voltage drop} = VDD - I \times R\_SUM \quad (8)$$

where I is a current value at any measurement point, and R_SUM is a resistance value from the voltage supply to the measurement point.

In Expression 8, if it is assumed that the measurement point 301 of FIG. 3 and the measurement point 401 of FIG. 4 have the same current value, the influence on the voltage drop in each of FIGS. 3 and 4 varies depending on the resistance value from the voltage supply to any measurement point. As described above, the resistance value in FIG. 4 where there is a limitation on the lengths and areas of interconnects is higher than that in FIG. 3 where there is not a limitation on the lengths and areas of interconnects. As can be seen from the foregoing description, the voltage drop at the measurement point 401 in FIG. 4 where there is a limitation on the lengths and areas of interconnects is larger than the voltage drop at the measurement point 301 in FIG. 3 where there is not a limitation on the lengths and areas of interconnects.

Therefore, when there is a limitation on the lengths and areas of power supply interconnects, an additional problem arises, i.e., the influence on the voltage drop increases.

In general, the influence on the voltage drop is taken into account when a delay is calculated in the design of a semiconductor integrated circuit, and therefore, the increase in the voltage drop interferes with the enhancement of performance of the semiconductor integrated circuit. While the lengths and areas of interconnects need to be limited to less than predetermined values from the point of view of ease of manufacture as shown in FIG. 2, the voltage drop needs to be reduced to the extent possible for the above reasons.

SUMMARY

According to the present disclosure, in a semiconductor integrated circuit including an interconnect layer in which there is a limitation on the lengths of interconnects or areas occupied by the interconnects, empty spaces between power supply interconnect segments having the same potential located in parallel to a priority interconnect direction, are shifted relative to each other within the limits of the lengths and areas of power supply interconnects. As a result, a local increase in resistance is dispersed, whereby an influence on a local voltage drop is reduced.

An example semiconductor integrated circuit interconnect structure according to the present disclosure and an example semiconductor device including the structure have a power supply interconnect structure in which a first empty space provided between first power supply interconnect segments having a same potential arranged in a first line extending in parallel to a priority interconnect direction, is shifted relative to a second empty space between second power supply interconnect segments having a same potential arranged in a second line adjacent to and extending along the first power supply interconnect segments and in parallel to the priority interconnect direction.

A third empty space may be provided between third power supply interconnect segments having a same potential arranged in a third line adjacent to and extending along the second power supply interconnect segments and in parallel to the priority interconnect direction on a side where the third power supply interconnect segments are not adjacent to the first power supply interconnect segments. The third empty space may be shifted relative to at least one of the first and second empty spaces.

A third empty space may be provided between third power supply interconnect segments having a same potential arranged in a third line adjacent to and extending along the second power supply interconnect segments and in parallel to the priority interconnect direction on a side where the third power supply interconnect segments are not adjacent to the first power supply interconnect segments. The third empty space may be shifted relative to both of the first and second empty spaces.

A third empty space may be provided between third power supply interconnect segments having a same potential arranged in a third line adjacent to and extending along the first power supply interconnect segments and in parallel to the priority interconnect direction on a side where the third power supply interconnect segments are not adjacent to the second power supply interconnect segments. A fourth empty space may be provided between fourth power supply interconnect segments having a same potential arranged in a fourth line adjacent to and extending along the second power supply interconnect segments and in parallel to the priority interconnect direction on a side where the fourth power supply interconnect segments are not adjacent to the first power supply interconnect segments. The first and third empty spaces may not be shifted relative to each other, and the second and fourth empty spaces may not be shifted relative to each other.

A power supply interconnect layer having the power supply interconnect structure in which the empty spaces between the power supply interconnect segments are shifted relative to each other may be provided in only a portion of all interconnect layers included in the semiconductor integrated circuit.

A power supply interconnect layer having the power supply interconnect structure in which the empty spaces between the power supply interconnect segments are shifted relative to each other may be provided in only an uppermost one of all interconnect layers included in the semiconductor integrated circuit.

The first and second empty spaces may be alternately shifted relative to each other so that power supply interconnects having a same potential in a same interconnect layer are arranged in a staggered pattern.

The first and second empty spaces may be shifted relative to each other so that the empty spaces between power supply interconnects having a same potential in a same interconnect layer are arranged in a diagonal pattern.

The first empty space between a first group including a portion of the power supply interconnect segments having a same potential and a same interconnect length located in parallel to the priority interconnect direction and a second group including another portion of the power supply interconnect segments having a same potential and a same interconnect length located in parallel to the priority interconnect direction, may be shifted relative to the second empty space between the power supply interconnect segment groups having the same potential extending in parallel thereto.

In another example semiconductor integrated circuit interconnect structure according to the present disclosure and an example semiconductor device including the structure, a first interval between two of vias of two power supply interconnect segments adjacent to a first empty space between vias, the two vias being closest to the first empty space, is equal to a second interval between two of vias of two power supply interconnect segments adjacent to a second empty space between vias, the two vias being closest to the second empty space and the two power supply interconnect segments adjacent to the second empty space facing the two power supply interconnect segments adjacent to the first empty space.

In still another example semiconductor integrated circuit interconnect structure according to the present disclosure and an example semiconductor device including the structure, a power supply interconnect segment connected to an IO element serving as a voltage supply is not shortest of all power supply interconnect segments having a same potential in a same interconnect layer.

In still another example semiconductor integrated circuit interconnect structure according to the present disclosure and an example semiconductor device including the structure, a power supply interconnect segment connected to an IO element serving as a voltage supply is longest of all power supply interconnect segments having a same potential in a same interconnect layer.

According to the present disclosure, the voltage drop is decreased to reduce an increase in margin and delay caused by the voltage drop during designing of a semiconductor integrated circuit, whereby the performance of the semiconductor integrated circuit can be enhanced.

DETAILED DESCRIPTION

Embodiments of the present disclosure will be described in detail hereinafter with reference to the accompanying drawings.

First Embodiment

A power supply interconnect structure and a semiconductor device according to a first embodiment of the present disclosure will be described with reference to FIGS. 5-9.

Figure 5:
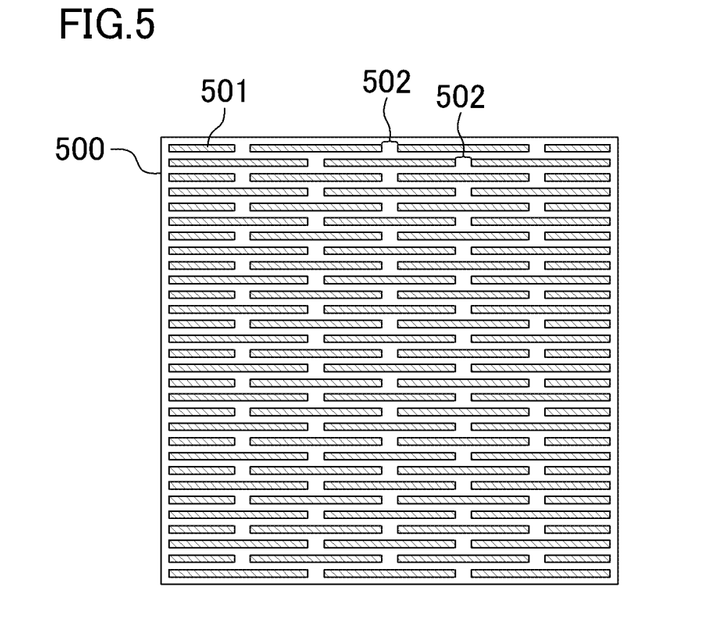
FIG. 5 is a plan view of a first power supply interconnect structure of a first embodiment.

FIG. 5 shows a first example of power supply interconnects in a semiconductor device having a multilayer interconnect structure. A reference numeral 500 indicates the perimeter of a chip of the semiconductor device. A reference numeral 501 indicates segments of power supply interconnects, which are the same as those indicated by the reference numerals 202-205 and 255-258 in FIG. 2. A reference numeral 502 indicates empty spaces between the power supply interconnect segments 501, which are the same as those indicated by the reference numerals 259 and 260 in FIG. 2. As shown in FIG. 5, the power supply interconnect segments 501 are arranged so that the power supply interconnect segments 501 and the empty spaces 502 are alternately located. With such a structure, when the resistance value R1" of the power supply interconnects 501 are calculated based on the model of FIG. 4 using Expressions 4-6, R1" is greater than R1' because the number of power supply interconnects (resistances) is smaller than that in the structure of FIG. 4. For example, if R1" is assumed to be 10 ($\Omega$), R_SUM" is calculated by:

$$R\_SUM'' = 1/(1/R1'' + 1/R3) + 1/(1/R1'' + 1/R3) + \\ 1/(1/R1'' + 1/R3) + 1/(1/R1'' + 1/R3) \\ = 28.6 (\Omega) \quad (9)$$

This R_SUM" is smaller than the resistance R_SUM'= 37.5 ($\Omega$) of the structure of FIG. 4. In other words, based on Expression 8, the magnitude of the voltage drop is smaller. Thus, the power supply interconnects of the structure of FIG. 5 reduce the magnitude of the voltage drop more effectively than the power supply interconnects of the structure of FIG. 4.

Figure 6:
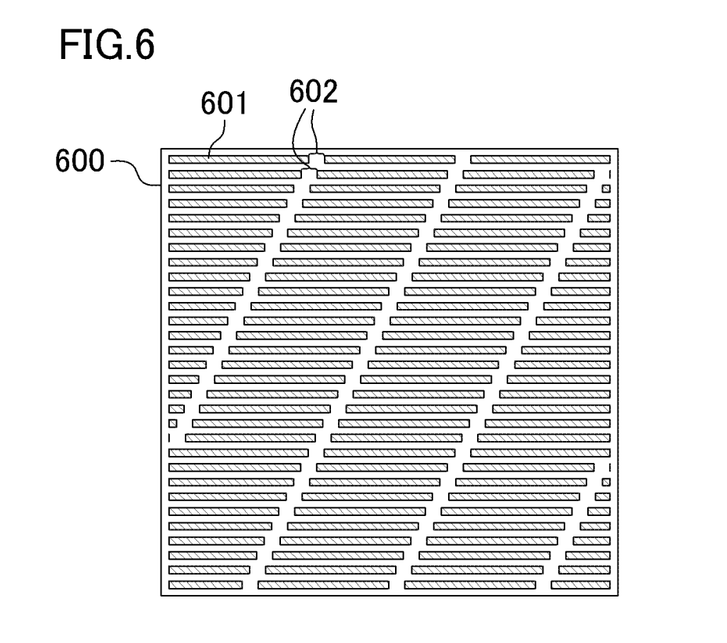
FIG. 6 is a plan view of a second power supply interconnect structure of the first embodiment.

FIG. 6 shows a second example of power supply interconnects in a semiconductor device having a multilayer interconnect structure. A reference numeral 600 indicates the perimeter of a chip of the semiconductor device. A reference numeral 601 indicates segments of power supply interconnects, which are the same as those indicated by the reference numerals 202-205 and 255-258 in FIG. 2. A reference numeral 602 indicates empty spaces between the power supply interconnect segments 601, which are the same as those indicated by the reference numerals 259 and 260 in FIG. 2. As shown in FIG. 6, the power supply interconnect segments 601 are arranged so that one empty space 602 between power supply interconnect segments 601 is slightly shifted from another empty space 602 between power supply interconnect segments 601 in the priority interconnect direction of power supply interconnects. The power supply interconnect structure of FIG. 6 also reduces the magnitude of the voltage drop more effectively than the power supply interconnects of the structure of FIG. 4 for a reason similar to that of the structure of FIG. 5. Moreover, because the number of power supply interconnects (resistances) connected together in parallel is smaller than that in the structure of FIG. 5, the power supply interconnect structure of FIG. 6 reduces the magnitude of the voltage drop more effectively than the structure of FIG. 5.

Figure 7:
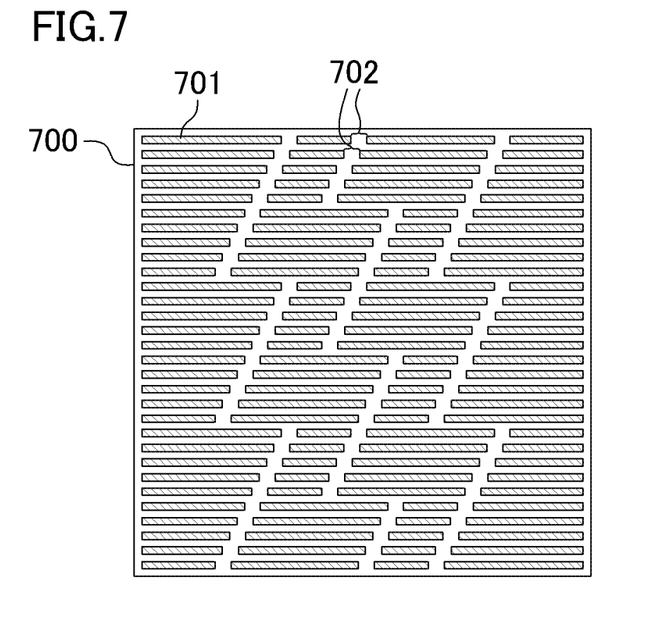
FIG. 7 is a plan view of a third power supply interconnect structure of the first embodiment.

FIG. 7 shows a third example of power supply interconnects in a semiconductor device having a multilayer interconnect structure. A reference numeral 700 indicates the perimeter of a chip of the semiconductor device. A reference numeral 701 indicates segments of power supply interconnects, which are the same as those indicated by the reference numerals 202-205 and 255-258 in FIG. 2. A reference numeral 702 indicates empty spaces between the power supply interconnect segments 701, which are the same as those indicated by the reference numerals 259 and 260 in FIG. 2. As shown in FIG. 7, the power supply interconnect segments 701 are arranged so that one empty space 702 between power supply interconnect segments 701 is slightly shifted from another empty space 702 between power supply interconnect segments 701 in the priority interconnect direction of power supply interconnects. The power supply interconnect structure of FIG. 7 also reduces the magnitude of the voltage drop more effectively than the power supply interconnects of the structure of FIG. 4 for a reason similar to that of the structure of FIG. 6. Moreover, because the chip perimeter 700, particularly, the lengths of power supply interconnects connected to the left and right sides (i.e., the voltage supply) is longer than that of FIG. 6, the magnitude of the voltage drop is advantageously reduced in the vicinity of the chip perimeter 700.

Figure 8:
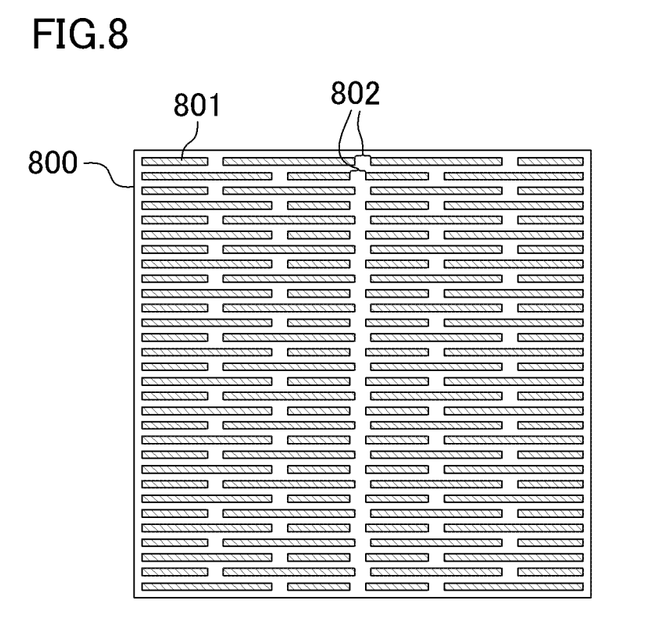
FIG. 8 is a plan view of a fourth power supply interconnect structure of the first embodiment.

FIG. 8 shows a fourth example of power supply interconnects in a semiconductor device having a multilayer interconnect structure. A reference numeral 800 indicates the perimeter of a chip of the semiconductor device. A reference numeral 801 indicates segments of power supply interconnects, which are the same as those indicated by the reference numerals 202-205 and 255-258 in FIG. 2. A reference numeral 802 indicates empty spaces between the power supply interconnect segments 801, which are the same as those indicated by the reference numerals 259 and 260 in FIG. 2. As shown in FIG. 8, the power supply interconnect segments 801 are arranged so that the power supply interconnect segments 801 and the empty spaces 802 are alternately located. The power supply interconnect structure of FIG. 8 reduces the magnitude of the voltage drop more effectively than the power supply interconnects of the structure of FIG. 4 for a reason similar to that of the structure of FIG. 5. Moreover, when the voltage supply is located on the left and right sides of the chip perimeter 800, the disconnections 802 of the power supply interconnects 801 are located in the vicinity of the center of the chip which has the largest magnitude of the voltage drop. Such a power supply interconnect structure is advantageous to a reduction in the magnitude of the voltage drop at other portions.

Figure 9:
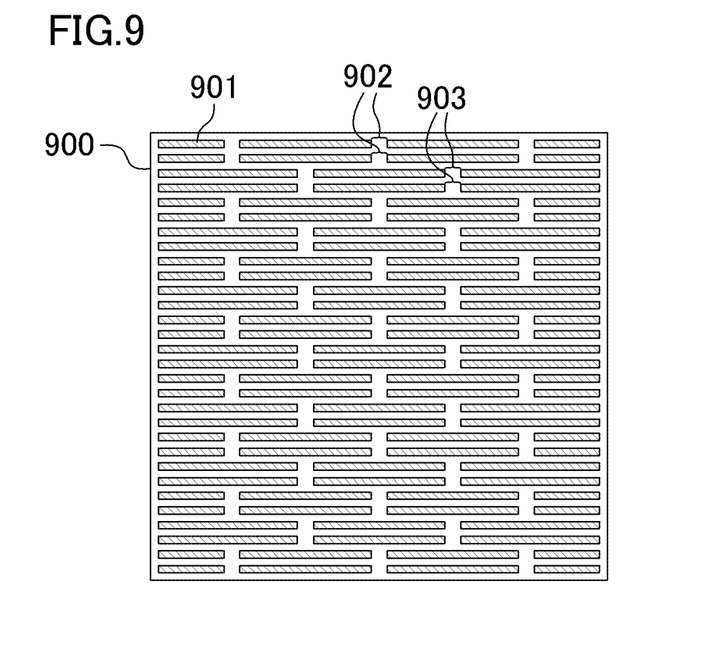
FIG. 9 is a plan view of a fifth power supply interconnect structure of the first embodiment.

FIG. 9 shows a fifth example of power supply interconnects in a semiconductor device having a multilayer interconnect structure. A reference numeral 900 indicates the perimeter of a chip of the semiconductor device. A reference numeral 901 indicates segments of power supply interconnects, which are the same as those indicated by the reference numerals 202-205 and 255-258 in FIG. 2. Reference numerals 902 and 903 indicate empty spaces between the power supply interconnect segments 901, which are the same as those indicated by the reference numerals 259 and 260 in FIG. 2. As shown in FIG. 9, the power supply interconnect segments 901 are divided into groups each including a plurality of power supply interconnect segments 901 having the same potential, which are connected and arranged in a structure similar to that of the example power supply interconnects of FIGS. 5, 6, 7, and 8. With such a power supply interconnect structure, a local voltage drop can be more reduced than when empty spaces between power supply interconnect segments are located in parallel.

Note that the example power supply interconnects of FIGS. 5, 6, 7, 8, and 9 may be laid out on an entire surface of the semiconductor integrated circuit. Note that when the semiconductor integrated circuit operates at a plurality of potentials, the power supply interconnects may be laid out within a range in which circuits operating at the same potential are provided.

Second Embodiment

Next, a power supply interconnect structure and a semiconductor device according to a second embodiment of the present disclosure will be described with reference to the drawings. In this embodiment, an interval between two of the vias of two power supply interconnect segments adjacent to an empty space, the two vias being closest to the empty space, is equal to an interval between two of the vias of two power supply interconnect segments adjacent to an empty space, the two power supply interconnect segments facing the former two power supply interconnect segments, respectively, and the two vias being closest to the empty space.

When a power supply interconnect structure is formed using interconnect layers in which there is a limitation on the lengths of interconnects, as shown in FIG. 2 there is a disconnection in the first interconnect layer between the power supply interconnect 202 and the power supply interconnect 255. An interval between the vias 217 and 218 closest to the disconnection is equal to a width of the empty space 259 between the power supply interconnect segments 202 and 255.

The interval between the vias 217 and 218 is equal to an interval between two of the vias of the power supply interconnects 203 and 256 in the first interconnect layer facing the two power supply interconnects 202 and 255 of interest, respectively, the two vias being closest to the empty space 260 between the power supply interconnects 203 and 256. Moreover, in this case, both ends of the power supply interconnects 202 and 255 including the vias 217 and 218 forming the via interval 259 do not stick out from the vias 217 and 218 adjacent to the empty space 259 between the power supply interconnects 202 and 255, respectively, and therefore, the interconnect resources can be fully utilized.

Figure 10:
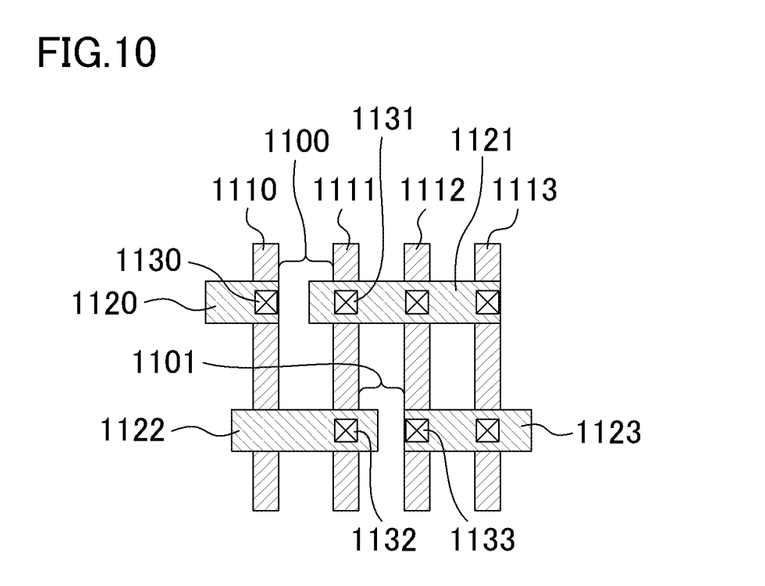
FIG. 10 is an enlarged plan view of a power supply interconnect structure for describing a second embodiment.

A case where an interconnect sticks out from a via into an empty space from the point of view of ease of manufacture will be described with reference to FIG. 10. Reference numerals 1100 and 1101 indicate empty spaces between vias, reference numerals 1110-1113 indicates power supply interconnects in an interconnect layer in which there is not a limitation on the lengths and areas of the interconnects. Here, the power supply interconnects 1110-1113 are referred to as power supply interconnects A. Reference numerals 1120-1123 indicate power supply interconnects in an interconnect layer in which there is a limitation on the lengths and areas of the interconnects. Here, the power supply interconnects 1120-1123 are referred to as power supply interconnects B. Reference numerals 1130-1133 indicate vias.

From the point of view of ease of manufacture, it may be contemplated that the power supply interconnects B (e.g., the interconnects 1121 and 1122) adjacent to empty spaces between vias stick out into the empty spaces between vias. In this case, resources for signal interconnects are more reduced than those in the case of FIG. 2, and therefore, the sticking-out portion of the interconnects is preferably minimized in order to efficiently use the interconnect resources.

Third Embodiment

Next, a power supply interconnect structure and a semiconductor device according to a third embodiment of the present disclosure will be described with reference to the drawings.

Figure 11:
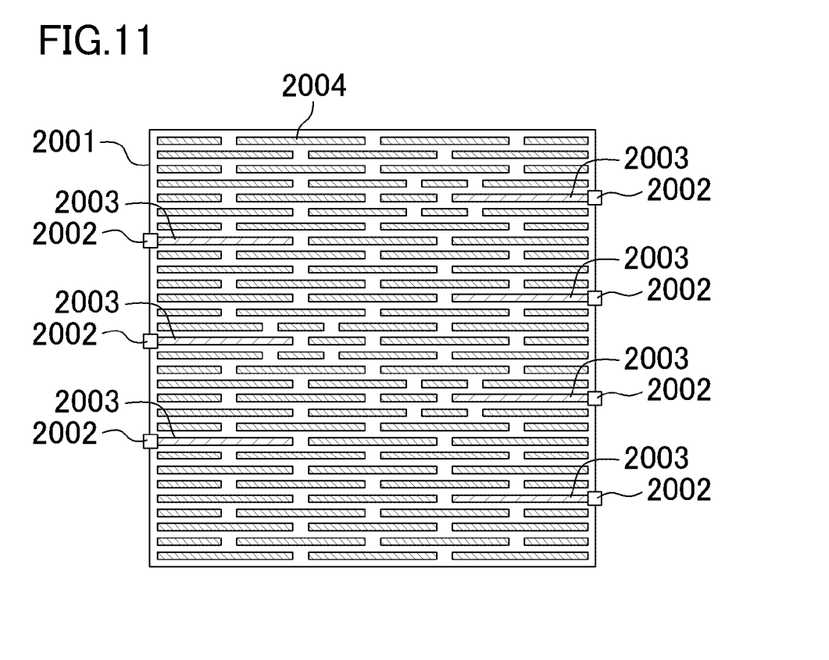
FIG. 11 is a plan view of a power supply interconnect structure for describing a third embodiment.

FIG. 11 is a plan view of the power supply interconnect structure of the semiconductor device of the third embodiment as viewed from above. In the power supply interconnect structure of FIG. 11, as is similar to FIG. 2, there is a limitation on the lengths and areas of interconnects in an interconnect layer. In FIG. 11, a reference numeral 2001 indicates the perimeter of a chip of the semiconductor device, a reference numeral 2002 indicates IO elements serving as voltage supplies, and reference numerals 2003 and 2004 indicate interconnects in the interconnect layer in which there is a limitation on the lengths and areas of the interconnects, which are the same as those indicated by the reference numerals 202-205 and 255-258 in FIG. 2. The reference numeral 2003 indicates the power supply interconnect segments which are connected to the IO elements 2002 serving as voltage supplies, and the reference numeral 2004 indicates the power supply interconnect segments which are not connected to the IO elements 2002. Here, the power supply interconnect segments 2003 and 2004 are provided in the same interconnect layer and have the same potential, as is similar to the first interconnect layer of FIG. 2.

A difference between this embodiment and the first embodiment is that the power supply interconnect segments 2003 connected to the IO elements 2002 serving as voltage supplies are longest of all of the power supply interconnect segments 2003 and 2004.

Figure 12:
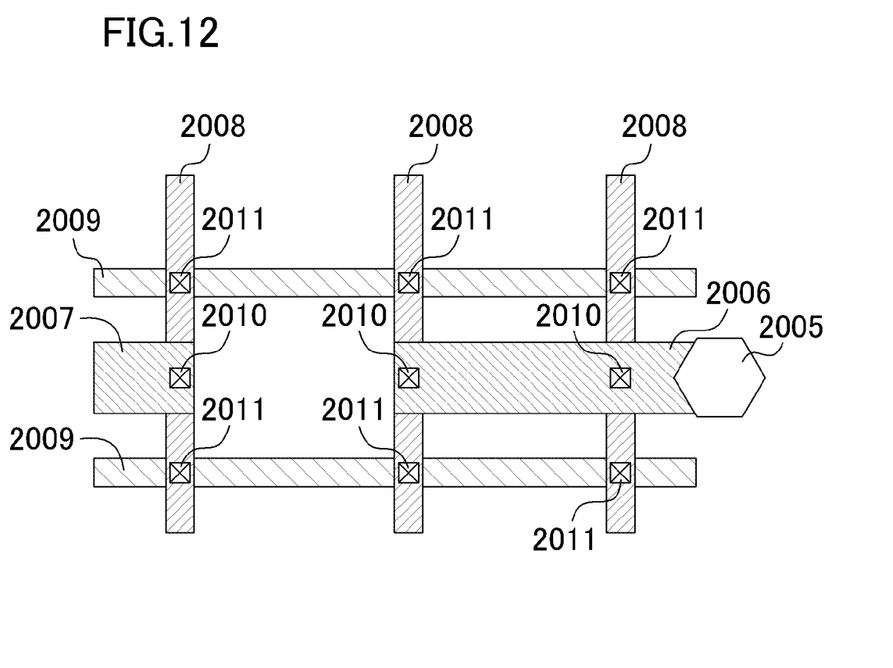
FIG. 12 is an enlarged plan view of the power supply interconnect structure for describing the third embodiment.

FIG. 12 is an enlarged plan view of a power supply interconnect structure for describing operation of this embodiment. In FIG. 12, a reference numeral 2005 indicates IO elements serving as voltage supplies, reference numerals 2006 and 2007 indicate interconnects in an interconnect layer in which there is a limitation on the lengths and areas of the interconnects, as is similar to the first interconnect layer of FIG. 2. The reference numerals 2006 indicate the power supply interconnect segments which are connected to the IO elements 2005 serving as voltage supplies, and the reference numeral 2007 indicates the power supply interconnect segments which are adjacent to the power supply interconnect segments 2006 in the parallel direction. In other words, the IO elements 2005 of FIG. 12 correspond to the IO elements 2002 of FIG. 11, and the power supply interconnect segments 2006 of FIG. 12 correspond to the power supply interconnect segments 2003 of FIG. 11.

Note that, in this example, the priority interconnect direction of the first interconnect layer is the lateral direction. If the priority interconnect direction of the first interconnect layer is the longitudinal direction, the power supply interconnect segments 2006 and 2007 are adjacent to each other in a direction perpendicular to the longitudinal direction. A reference numeral 2008 indicates power supply interconnect segments provided in a layer below or above the interconnect layer in which the power supply interconnect segments 2006 and 2007 are provided, as is similar to the second interconnect layer of FIG. 2. A reference numeral 2009 indicates power supply interconnect segments provided in a layer below or above the interconnect layer in which the power supply interconnect segments 2008 are provided, as is similar to the third interconnect layer of FIG. 2. A reference numeral 2010 indicates vias which connect together the power supply interconnect segments 2006 or 2007 and the power supply interconnect segments 2008 provided in the layer above or below the layer in which the power supply interconnect segments 2006 or 2007 are provided, and are similar to those indicated by the reference numerals 215-234 in FIG. 2. Moreover, a reference numeral 2011 indicates vias which connect the power supply interconnect segments 2008 and the power supply interconnect segments 2009 together, and are similar to those indicated by the reference numerals 235-254 in FIG. 2. The power supply interconnect segments 2008 and 2009, and the vias 2010 and 2011, are assumed to be continuously arranged in a grid pattern. The power supply interconnect segments 2006 and 2007 are assumed to have a larger interconnect width and a lower interconnect resistance value than those of the other power supply interconnect segments 2008 and 2009.

Operation of this embodiment will be described hereinafter with reference to FIG. 12. A current supplied from the IO element 2005 flows from the power supply interconnect segment 2006 via the via 2010 to the power supply interconnect segment 2008 and then via the via 2011 to the power supply interconnect segment 2009. The current also flows from the power supply interconnect segment 2009 via the via 2011 to the power supply interconnect segment 2008 and then via the via 2010 to the power supply interconnect segment 2007.

The power supply interconnect segment 2006 connected to the IO element 2005 has a low interconnect resistance value, and therefore, a resistance value to any point is reduced as the length of the power supply interconnect segment 2006 is increased. In other words, as represented by Expression 8, as the resistance value from the voltage supply decreases, a voltage drop at that point is reduced.

As described above, according to this embodiment, the power supply interconnect segment 2003 or 2006 connected to the IO element 2002 or 2005 serving as a voltage supply is longest of all power supply interconnect segments having the same potential provided in the same interconnect layer. As a result, even when there is a limitation on the segment length, a current supplied from the voltage supply can be kept at the maximum level, whereby the voltage drop in the entire semiconductor integrated circuit can be reduced.

Although, in FIG. 11, it has been assumed that the power supply interconnect segment 2003 connected to the IO element 2002 serving as a voltage supply is longest of all power supply interconnect segments, the voltage drop can be reduced even if the power supply interconnect segment 2003 connected to the IO element 2002 serving as a voltage supply has a predetermined length or more.

The semiconductor device of the present disclosure has an interconnect structure which reduces a voltage drop, and is useful as an interconnect structure of a semiconductor integrated circuit which reduces a margin for the semiconductor integrated circuit.

What is claimed is:

1. A semiconductor device comprising:
   a power supply interconnect structure including:
     first power supply interconnect segments having a same potential arranged in a first line extending in parallel to a first direction, a first space being provided between the first power supply interconnect segments; and
     second power supply interconnect segments having the same potential arranged in a second line extending along the first power supply interconnect segments and in parallel to the first direction, a second space being provided between the second power supply interconnect segments, wherein:
   the first space is shifted relative to the second space in a second direction perpendicular to the first direction, and
   the first power supply interconnect segments arranged in the first line and the second power supply interconnect segments arranged in the second line are adjacent to each other and are provided in a same interconnect layer.

2. The semiconductor device of claim 1, wherein:
   the interconnect structure further includes:
     third power supply interconnect segments having the same potential, arranged in a third line adjacent to the second line, extending in parallel to the first direction and disposed on a side where the first power supply interconnect segments are not provided, a third space being provided between the third power supply interconnect segments, and
   the third space is shifted relative to at least one of the first and second spaces in the second direction.

3. The semiconductor device of claim 1, wherein:
   the interconnect structure further includes:
     third power supply interconnect segments having the same potential, arranged in a third line adjacent to the second line, extending in parallel to the first direction and disposed on a side where the first power supply interconnect segments are not provided, a third space being provided between the third power supply interconnect segments, and
   the third space is shifted relative to both of the first and second spaces in the second direction.

4. The semiconductor device of claim 1, wherein:
   the interconnect structure further includes:
     third power supply interconnect segments having the same potential arranged in a third line adjacent to the first line, extending in parallel to the first direction and disposed on a side where the second power supply interconnect segments are not provided, a third space being provided between the third power supply interconnect segments,
     fourth power supply interconnect segments having the same potential arranged in a fourth line adjacent to the second line, extending in parallel to the first direction on a side where the first power supply interconnect segments are not provided, a fourth space being provided between the fourth power supply interconnect segments, and
   the first and third spaces are not shifted relative to each other in the second direction, and the second and fourth spaces are not shifted relative to each other in the second direction.

5. The semiconductor device of claim 1, wherein:
   the semiconductor device comprises interconnect layers, and
   the power supply interconnect structure is provided in only a portion of the interconnect layers.

6. The semiconductor device of claim 1, wherein:

the semiconductor device comprises interconnect layers, and the power supply interconnect structure is provided in only an uppermost one of the interconnect layers.

7. The semiconductor device of claim 1, wherein the first and second spaces are alternately shifted relative to each other so that power supply interconnects having the same potential in the same interconnect layer are arranged in a staggered pattern.

8. The semiconductor device of claim 1, wherein the first and second spaces are shifted relative to each other so that the first and second spaces having the same potential in the same interconnect layer are arranged in a diagonal pattern with respect to the first and second directions.

9. The semiconductor device of claim 1, wherein:

plural sets of the first interconnect segments having the same potential and a same length in the first direction are provided as a first group, plural sets of the second interconnect segments having the same potential and a same length in the first direction are provided as a second group, the second group being disposed adjacent to the first group, and first spaces in the first group is shifted relative to second spaces in the second group in the second direction.

10. The semiconductor device of claim 1, wherein:

the first power supply interconnect segments are connected to first vias, the second power supply interconnect segments are connected to second vias, and an interval between a pair of vias disposed adjacent to and bridging the first space among the first vias is equal to an interval between a pair of vias disposed adjacent to and bridging the second space among the second vias.

* * * * *